United States Patent [19]

Tsutomu

[11] 4,038,104
[45] July 26, 1977

[54] SOLAR BATTERY
[75] Inventor: Otake Tsutomu, Suwa, Japan
[73] Assignee: Kabushiki Kaisha Suwa Seikosha, Tokyo, Japan
[21] Appl. No.: 693,564
[22] Filed: June 7, 1976
[30] Foreign Application Priority Data
　　June 9, 1975　Japan .......................................50-6995
[51] Int. Cl.² .......................................... H01L 31/04
[52] U.S. Cl. ................................. 136/89 P; 58/23 C; 136/89 AC
[58] Field of Search ............. 136/89 P, 89 PC, 89 AC
[56] References Cited
U.S. PATENT DOCUMENTS

| | | | |
|---|---|---|---|
| 2,305,576 | 12/1942 | Lamb | 136/89 |
| 2,428,537 | 10/1947 | Veszi et al. | 136/89 |
| 2,911,539 | 11/1959 | Tanenbaum | 250/211 |
| 3,020,412 | 2/1962 | Byczkowski | 250/211 |
| 3,151,379 | 10/1964 | Escoffery | 29/25.3 |
| 3,427,797 | 2/1969 | Kimura | 58/23 |
| 3,509,712 | 5/1970 | Grohoski | 58/23 |
| 3,546,542 | 12/1970 | Riel et al. | 317/234 |
| 3,616,528 | 11/1971 | Paine | 29/572 |
| 3,760,240 | 9/1973 | Bergt | 317/235 R |

FOREIGN PATENT DOCUMENTS

| | | | |
|---|---|---|---|
| 46-24175 | 1971 | Japan | 136/89 |

*Primary Examiner*—John H. Mack
*Assistant Examiner*—Aaron Weisstuch
*Attorney, Agent, or Firm*—Blum, Moscovitz, Friedman & Kaplan

[57] ABSTRACT

A solar battery is manufactured by forming individual cells in a wafer, mounting the wafer on a substrate and separating the cells by the use of a thin saw. The channel thus formed between the cells is filled with an insulating material to prevent the accidental entry of stray material which might result in unwanted conduction between the cells. Preferably the insulating material between the cells is the same color as the cells in the interest of enhanced appearance.

7 Claims, 7 Drawing Figures

SOLAR BATTERY

BACKGROUND OF THE INVENTION

In an array of solar cells used as the power source for a device such as a clock, a wristwatch, an electronic calculator or the like, it is generally the case that only a limited area is available in which solar cells can be exposed to the light. Thus, it is essential that the active area of the cells utilize the available area as nearly completely as possible. Consequently, the space consumed by insulative materials separating adjoining cells must be minimized.

Conventionally, solar cells are placed together as closely as possible without incurring substantial danger of making contact between adjoining cells and thus developing a short which will limit the output of the array. Moreover, in order to make maximum utilization of the space available, the cells must be placed in some sort of orderly configuration. With rectangular cells, the configuration will be essentially rectangular. For a circular array, the cells are conveniently sectorial in shape. Up to now, conventional techniques have made it essentially impossible to decrease the separation between cells below about 0.3 mm, even where the individual carrying out the fabrication is of the highest skill. A separation of this magnitude, as indicated by the discussion up to this point, involves a serious waste of the available area. In addition, the gap between the solar cells is relatively conspicuous and where the cells are to be used in a devie such as a lady's wristwatch, the gap between the cells constitutes an eyesore. The same holds true, though, perhaps to a lesser extent, whenever a solar battery is to be used in ornamental goods such as clocks and wristwatches for men.

As is evident, it would be desirable to improve methods of fabrication so that solar batteries could be made available which utilize virtually all of the space provided and which do not suffer from the defect of conspicuous gaps between adjoining cells.

SUMMARY OF THE INVENTION

In accordance with the present invention, solar cells are formed in a wafer, preferably of silicon, with a minimum spacing between said cells. The wafer is mounted on a substrate of glass, ceramic or another silicon wafer. Channels are cut between adjoining solar cells using a dicing saw, the channel being cut to a depth such that it completely separates the cells. Using a dicing saw having a thickness of 25 u, the width of the channel will be between 30 and 40 microns.

If desired, where a silicon wafer is used as the substrate, the silicon substrate may be oxidized to form an insulating layer of silicon dioxide thereon prior to mounting the solar cell array thereon.

After cutting the channels, it is desirable to fill them with an insulating material such as a wax or a resin.

Accordingly, an object of the present invention is a solar battery which makes maximum use of the area available for the reception of light thereon.

Another object of the present invention is a solar battery wherein the space between adjacent cells is held to a minimum.

A further object of the present invention is a solar battery having minimum spacing between cells wherein the possibility of accidental shorting between cells is eliminated.

Still another object of the present invention is a method of manufacturing a solar array or battery in such a way that the spacing between adjacent cells is held to a minimum.

An important object of the present invention is a method of manufacturing a solar array in which the appearance of the array is not marred by the presence of conspicuous gaps between adjacent cells.

Still other objects and advantages of the invention will in part be obvious and will in part be apparent from the specification.

The invention accordingly comprises the several steps and the relation of one or more of such steps with respect to each of the others, and the article possessing the features, properties, and the relation of elements, which are exemplified in the following detailed disclosure, and the scope of the invention will be indicated in the claims.

BRIEF DESCRIPTION OF THE DRAWINGS

For a fuller understanding of the invention, reference is had to the following description taken in connection with the accompanying drawings, in which:

FIG. 3b is an elevational view of the array of FIG. 3a;

DESCRIPTION OF THE PREFERRED EMBODIMENTS

Figure 1:
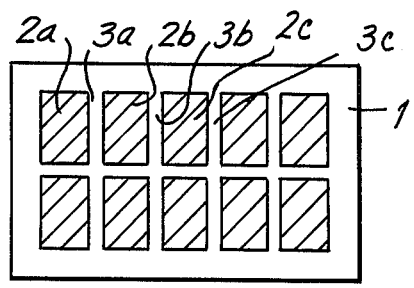
FIG. 1 is a rectangular array of solar cells in accordance with the prior art.
Figure 2:
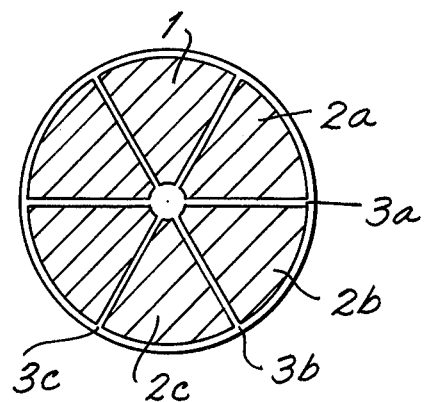
FIG. 2 is a circular array of solar cells in accordance with the prior art.

The conventional solar battery array of FIG. 1 consists of solar cells 2a, 2b, 2c, etc. on a printed-circuit substrate 1, adjoining cells being separated by strips indicated by reference characters 3a, 3b, 3c, etc. The spacing between cells ranges from 0.3 mm to 1.0 mm, and the solar cells in the array are connected together by means of the printed circuit substrate. The array of FIG. 1 is rectangular in shape as are the individual solar cells. In contrast, the solar battery array of FIG. 2, which is also conventinal, is circular and the individual cells are wedge-shaped, the cells being separated from adjoining cells by means of the strips 3a, 3b, 3c, etc.

In these conventional arrangements, the separation between adjoining cells must be relatively large, separation being essential in order to avoid undesired shorting between adjacent cells. The gaps between the cells cannot be reduced below about 0.3 mm without introducing the danger of shorting, even when the construction is carried out by those with the highest skill.

It is also conventional to insert insulating material in the gaps between the cells where the insulating material is of the same color as the solar cells. However, where the gap is as large as 0.3 mm or greater, the insulating material is conspicuous and constitutes a serious defect in the overall appearance of the battery.

Figure 3A:
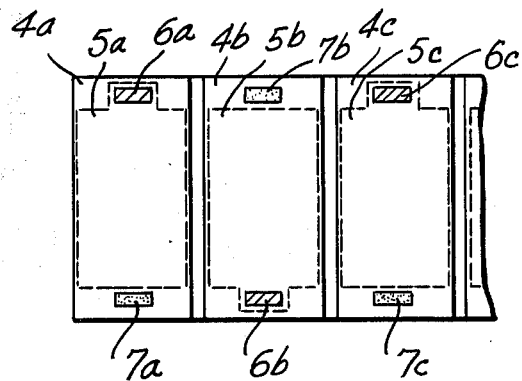
FIG. 3a is a plan view of a solar array in accordance with the present invention.

A solar battery panel in accordance with the present invention may conveniently be composed of six cells, preferably of silicon, the cells being connected in series. A suitable size of a unit cell is about 4 mm x 13 mm. As shown in FIG. 3a, p-type diffusion layers 5a, 5b, 5c, etc., p-type side electrodes 6a, 6b, 6c, etc., n-type side electrodes 7a, 7b, 7c, etc., and so on are formed on the n-type silicon substrates 4a, 4b, 4c, etc. As can be seen from FIG. 3a, the polarity of each cell is reversed with respect to the adjacent cell or cells. As is evident from this Figure, the cells can be placed in series by connecting the electrode 6a with electrode 7b, 6b with electrode 7c, and so on. Connection can be effected by wire-bonding, soldering of lead wire, soldering of copper leaf on transparent tape or printed leads (not shown) on substrate 9 of FIG. 3b. The connections between cells need not be visible since the cells can be placed behind a dial plate having an opening such that the electrodes are hidden and only portions 5a, 5b, 5c, etc. are visible.

Figure 3B:
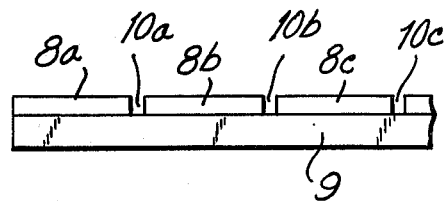

FIG. 3b is an end view of the solar battery panel shown in FIG. 3a. The unit cells 8a, 8b, 8c, etc. are bonded to reinforcing substrate 9 as by an adhesive or cement (not shown) and the cells are separated from each other by cut-grooves or channels 10a, 10b, 10c, etc., the grooves being equal in depth to the thickness of the cells so that the grooves reach downward to the substrate 9.

In a solar battery panel made by conventional means, the unit cells are assembled individually on the insulating substrate, the cells having been cut individually from the wafer subsequent to formation. It is the difficulty in insuring the presence of a positive gap between adjacent cells during the assembly on the substrate which makes it necessary to provide so large a gap between adjacent cells in the conventinal method of assembly. The advantage of the present invention lies in the fact that the grooves or channels between adjacent cells are very narrow in width, this being the result of cutting the grooves subsequent to mounting the wafer on the substrate.

The preferred method in accordance with the invention is to produce, by conventional means, a plurality of unit cells on a single wafer, preferably of silicon, the gap between adjacent unit cells being about 100 μ. The wafer is then mounted on reinforcing substrate 9 using a material such as epoxy resin, electron wax or the like. The substrate may be of ceramics, glass or even another semiconductor substrate such as silicon. The gap should be in excess of about 40 μ.

Once the wafer is fixed to the substrate, channels or grooves are cut between adjacent cells by means of a dicing saw. The minimum blade thickness is about 25 μ, but movement of the blade from side to side during the cutting process causes the width of the notch produced to be between 30 and 40 μ. Wafers are generally about 20 μ thick, and the depth to which the channel is cut by means of the dicing saw can readily be controlled so that the cells are completely separated in the cutting process while avoiding penetration to any substantial extent into the substrate. However, if the number of cells in a wafer is larger than the number desired for an array, for instance, six unit cells, then a block of cells can be prepared by cutting deeply enough into the reinforcing substrate to separate off such a group. When a silicon wafer is used as the reinforcing substrate, additional insulation between the cells can be provided by oxidizing the surface of the reinforcing substrate to form a film of $SiO_2$ prior to bonding the solar array thereto.

Figure 4:
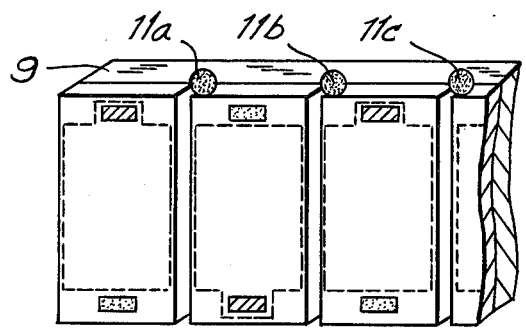
FIG. 4 is a view in perspective of a solar battery mounted on a substrate in preparation for filling the channels between adjacent cells with an insulating material.
Figure 5:
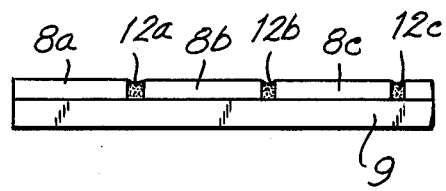
FIG. 5 is an end view of the assembly of FIG. 4.

Channels having a maximum width of 40 μ are relatively inconspicuous. Although this is advantageous, the narrow spacing of the walls of the grooves makes it possible for particles of silicon or other materials which fall into the grooves to provide a conductive path between the n-type areas of the unit cells, such conduction decreasing the electromotive force provided by the array. This difficulty can be avoided by introducing an insulating material into the channels. In preparation for this step, after the solar array is grooved, the grooves are washed out and dried, the assembly is placed with the solar cell face positioned upwardly as shown in FIG. 3b and a granule of wax 11a, 11b, 11c, etc. is placed at one end of each of the grooves as shown in FIG. 4. The assembly is taken up to a temperature of about 80° C, the wax being selected so that its melting point is below this temperature, and the wax then melts and fills the grooves under the effects of gravity and capillarity. As shown in FIG. 5, complete insulation is supplied by the electron wax 12a, 12b, 12c, etc. which essentially fills the grooves, the wax having solidified on cooling.

The grooves are so narrow that even when the insulating material is not identical in color with the solar cells, it can hardly be seen. However, of course, it is preferable that the wax match the color of the solar cells. Nevertheless, the fact that the wax need not match exactly makes it possible to utilize a wide variety of insulating materials.

Figure 6:
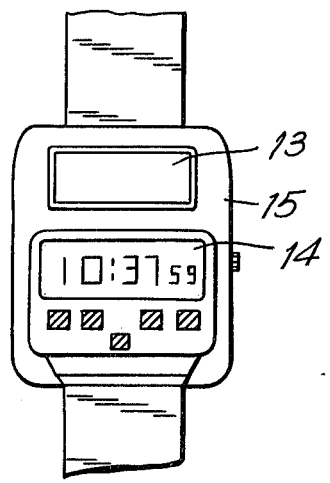
FIG. 6 is a plan view of a wristwatch including a solar battery in accordance with the present invention.

A wristwatch utilizing a solar cell array in accordance with the present invention is shown in FIG. 6 wherein the face of the watch includes a solar panel 13 and a liquid crystal display panel 14. The electrodes of the solar battery are hidden behind the case 15.

The advantages of a solar array in accordance with the present invention derive from the ease with which the battery is assembled, the freedom of choice of insulating material and the superior appearance as compared with conventional solar battery arrays. Moreover, reliability is enhanced due to the fact that the mode of insulation is so positive.

The invention can be applied widely as a power source for such devices as electronic calculators, electronic table calculators, clocks, cigarette lighters, transistor radios or the like, as well as wristwatches.

It will thus be seen that the objects set forth above, among those made apparent from the preceding description, are efficiently attained and, since certain changes may be made in carrying out the above method and in the article set forth without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

What is claimed is:

1. A solar battery comprising a plurality of solar cells, and a substrate on which said cells are mounted with channels therebetween, said channels between adjoining cells being up to about 40 μ in width, and being at least equal in depth to the thickness of said solar cells.

2. The solar battery as defind in claim 1, wherein said channels contain an insulating material.

3. The solar battery as defined in claim 2, wherein the color of said insulating material approximates that of said solar cells, thereby enhancing the appearance of said battery.

4. The solar battery as defined in claim 1, wherein said cells are bonded to said substrate.

5. The solar battery as defined in claim 1, wherein said substrate is selected from the group consisting of ceramics, glass and silicon wafers.

6. The solar battery as defined in claim 1, wherein said solar cells are of silicon.

7. The solar battery as defined in claim 1, wherein said substrate is a silicon wafer, and further comprising a layer of $SiO_2$ between said substrate and said solar cells.

* * * * *